(12) United States Patent
Lee

(10) Patent No.: US 12,148,634 B2
(45) Date of Patent: Nov. 19, 2024

(54) DEVICE FOR ETCHING THE PERIPHERY EDGE OF A SUBSTRATE COMPRISING SUBSTRATE SENSING UNIT

(71) Applicant: DEVICEENG CO., LTD., Chungcheongnam-do (KR)

(72) Inventor: Taek Youb Lee, Chungcheongnam-do (KR)

(73) Assignee: DEVICEENG CO., LTD., Chungcheongnam-do (KR)

( * ) Notice: Subject to any disclaimer, the term of this patent is extended or adjusted under 35 U.S.C. 154(b) by 305 days.

(21) Appl. No.: 17/729,067

(22) Filed: Apr. 26, 2022

(65) Prior Publication Data

US 2023/0268201 A1    Aug. 24, 2023

(30) Foreign Application Priority Data

Feb. 21, 2022    (KR) ........................ 10-2022-0022465

(51) Int. Cl.
     *H01L 21/67*      (2006.01)
     *H01L 21/687*     (2006.01)

(52) U.S. Cl.
     CPC .. *H01L 21/67069* (2013.01); *H01L 21/68742* (2013.01); *H01L 21/68785* (2013.01)

(58) Field of Classification Search
     CPC ............. H01L 21/67253; H01L 21/681; H01L 21/67259
See application file for complete search history.

(56) References Cited

U.S. PATENT DOCUMENTS

| | | | |
|---|---|---|---|
| 2004/0040177 A1* | 3/2004 | Izumi ................ | H01L 21/67034 34/492 |
| 2004/0192053 A1* | 9/2004 | Fujimoto .......... | H01L 21/31116 257/E21.252 |
| 2008/0128088 A1 | 6/2008 | Junn et al. | |

FOREIGN PATENT DOCUMENTS

JP      62/268139     * 11/1987

OTHER PUBLICATIONS

JP62/268139, Tsuneo, Nov. 20, 1987—Eng machine translation (Year: 1987).*

* cited by examiner

*Primary Examiner* — Joseph A Miller, Jr.
(74) *Attorney, Agent, or Firm* — BLANK ROME LLP

(57) ABSTRACT

The present invention relates to a substrate edge etching apparatus including: a substrate support assembly having a horizontally rotatable chuck base with a light through hole vertically penetrating a center thereof and chuck pins disposed on top of the chuck base; a spin motor for rotating the substrate support assembly; a purge gas supply assembly connected to the driving shaft through a bearing, extending vertically from the underside center of the chuck base, and having a hollow hole penetratingly extending therealong to supply a purge gas to the light through hole; and a substrate sensing unit having a light transmission part disposed inside the hollow hole of the purge gas supply assembly and a light reception part disposed apart above the light through hole of the chuck base.

9 Claims, 5 Drawing Sheets

PRIOR ART

DEVICE FOR ETCHING THE PERIPHERY EDGE OF A SUBSTRATE COMPRISING SUBSTRATE SENSING UNIT

CROSS REFERENCE TO RELATED APPLICATION OF THE INVENTION

The present application claims the benefit of Korean Patent Application No. 10-2022-0022465 filed in the Korean Intellectual Property Office on Feb. 21, 2022, the entire contents of which are incorporated herein by reference.

BACKGROUND OF THE INVENTION

Field of the Invention

The present invention relates to a substrate edge etching apparatus having a substrate sensing unit, and more specifically, to a substrate edge etching apparatus that is capable of etching a peripheral edge of a substrate by means of the application of a chemical liquid thereto in a state where a treatment surface of the substrate, on which a circuit pattern is formed, is facingly placed on top thereof, while having a substrate sensing unit.

Background of the Related Art

Generally, a process of forming a circuit pattern on a substrate includes various steps such as oxidation, photolithography, etching, deposition, metallization, and the like, which are performed on one surface of the substrate.

While such steps are being performed, all kinds of foreign substances are attached to a peripheral edge of the substrate to the form of layers.

Accordingly, the peripheral edge of the substrate cannot be utilized in forming the circuit pattern, and of course, it actually has no circuit pattern formed thereon.

If the peripheral edge of the substrate is fixed by chuck pins to perform the circuit pattern formation process, however, the layers of foreign substances attached to the peripheral edge of the substrate may be cracked, so that the foreign substances may enter the inside of the substrate, and otherwise, particles generated from the foreign substances may invade the inside of the substrate, thereby making it difficult to form the circuit pattern on the substrate.

To prevent such problems from occurring, there is a need to in advance etch and remove the layers of foreign substances formed on the peripheral edge of the substrate.

FIG. 1 schematically shows a general process of etching a peripheral edge of a substrate.

The substrate edge etching is largely divided into wet etching and dry etching.

The wet etching is performed by supplying a chemical liquid to the peripheral edge of a substrate excepting a portion to be not etched on top of the substrate and etching the peripheral edge of the substrate, and the dry etching is performed by generating plasma, exciting reactive gas in the plasma, and etching the peripheral edge of the substrate.

In specific, the wet etching is performed by protecting the portion to be not etched on the center of top of the substrate by means of a mask, submerging the substrate into the chemical liquid (etching liquid) filled in a bath, and etching the peripheral edge of the substrate, and otherwise, the wet etching is performed by rotating a substrate support assembly, in a state where the substrate is reversely located on the substrate support assembly to allow a treatment surface on which a circuit pattern is formed to be facingly on top of the substrate support assembly, supplying a chemical liquid to top of the substrate, and supplying a purge gas such as nitrogen gas N2 and the like to underside of the substrate.

In the process of performing etching for the peripheral edge of the substrate on the rotating substrate support assembly, the chemical liquid is supplied to the peripheral edge of the substrate in a state where the substrate is fixed to chuck pins of the substrate support assembly, and in this case, the substrate may be damaged or broken during the rotation of the substrate support assembly due to the damage on the substrate itself or unstable fixing of the chuck pins thereto. Further, next substrate may be damaged by the fine pieces of the damaged or broken substrate.

Further, the processed substrate has to be taken out of the substrate support assembly under a command for taking the substrate out, but in some cases, the substrate remains on a substrate edge etching apparatus due to malfunctions of the apparatus and thus interferes with the substrate entering newly, so that both of the substrate and the apparatus may be damaged.

To solve such problems, there is a need to in advance detect the existence of the substrate during rotation, and if it is determined that no substrate exists, the operation of the substrate edge etching apparatus is immediately stopped to thus perform post-processing works such as cleaning and the like. And, if it is determined that the substrate exists in a situation where the substrate has to be taken out, the operation of the apparatus is stopped to check the current states of the substrate and the apparatus.

In conventional practices, generally, a vision camera is adopted to sense whether the substrate exists or not, but the vision camera has a relatively higher price than a sensor, which undesirably raises a production cost of the apparatus.

Further, a sensor may be disposed at a space between the substrate and the substrate support assembly, but in this case, the space having a size of maximum several millimeters is very narrow, thereby making it really hard to mount the sensor onto the space.

SUMMARY OF THE INVENTION

Accordingly, the present invention has been made in view of the above-mentioned problems occurring in the related art, and it is an object of the present invention to provide a substrate edge etching apparatus having a substrate sensing unit that is capable of mounting low-priced light transmitting and receiving sensors thereon to greatly reduce a production cost thereof.

To accomplish the above-mentioned objects, according to the present invention, there is provided a substrate edge etching apparatus including: a substrate support assembly having a horizontally rotatable chuck base with a light through hole vertically penetrating a center thereof and chuck pins disposed on top of the chuck base to support a substrate; a spin motor having a hollow tube-shaped driving shaft adapted to rotate the substrate support assembly; a purge gas supply assembly connected to the driving shaft through a bearing in a state of not rotating, extending vertically from the underside center of the chuck base in a state of being spaced apart from an underside of the chuck base, and having a hollow hole penetratingly extending therealong in an upward and downward direction thereof to supply a purge gas to the light through hole; and a substrate sensing unit having a light transmission part disposed inside the hollow hole of the purge gas supply assembly and a light reception part disposed apart above the light through hole of the chuck base, wherein light that is transmitted from the light transmission part and passes through the hollow hole and the light through hole is sensed by means of the light reception part.

According to the present invention, desirably, the light transmission part may include: an inner tube disposed inside the hollow hole to extend toward the extension direction of the hollow hole; a light transmitter disposed inside the inner tube; and a cable passing through a connection hole formed on a side periphery of the purge gas supply assembly and thus drawn to the outside from the light transmitter.

According to the present invention, desirably, the light transmission part may further include an adapter detachably mounted on the connection hole in a state of encompassing the cable.

According to the present invention, desirably, the light through hole is defined by a purge gas inlet hole extending from an underside center of the chuck base to an interior of the chuck base in a vertical direction thereof, a purge gas outlet hole extending radially from the purge gas inlet hole and then extending upwardly to penetrate top of the chuck base, and a bypass path extending vertically from a center of top of the chuck base to communicate with the purge gas outlet hole.

According to the present invention, desirably, the purge gas supply assembly may include: a purge gas guide tube spaced apart from a periphery of the purge gas inlet hole to surround the periphery of the purge gas inlet hole in a radial direction thereof in a plan view and having the hollow hole penetratingly extending in the upward and downward direction in a side view; a purge gas supply tube connected with the lower end periphery of the purge gas guide tube to communicate with the hollow hole and having the connection hole formed on the outer peripheral surface thereof; a purge gas introduction tube extending downward from the underside of the chuck base to communicate with the purge gas inlet hole and spaced apart from the purge gas guide tube in a radial direction thereof inside the purge gas guide tube; and a hollow tube-shaped purge gas guide tube support shaft spacedly overlaid onto top of the purge gas guide tube in an outer radial direction of the purge gas guide tube and adapted to mount the bearing thereonto to support the driving shaft.

According to the present invention, desirably, a path formed between the purge gas introduction tube and the purge gas guide tube, a path formed between the underside of the chuck base and the top end of the purge gas guide tube, and a path formed between the purge gas guide tube support shaft and the driving shaft provide a first purge gas exhaust path.

According to the present invention, desirably, the purge gas guide tube has a plurality of communication holes spaced apart from one another on an upper surface thereof in a circumferential direction thereof, and the path formed between the purge gas guide tube and the purge gas introduction tube, the plurality of communication holes, and a path formed between the purge gas guide tube and the purge gas guide tube support shaft provide a second purge gas exhaust path.

According to the present invention, desirably, the chuck base may include a cover installation hole formed on a center thereof to communicate with the bypass path, a cover detachably mounted on the cover installation hole, and a light emitting hole formed on a center of the cover thereon to allow the bypass path to communicate with the outside.

According to the present invention, desirably, the chuck base may include a cover installation hole formed on a center thereof to communicate with the bypass path and a cover detachably mounted on the cover installation hole and made of a transparent material.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Hereinafter, an embodiment of the present invention will be explained in detail with reference to the attached drawings.

Figure 1:
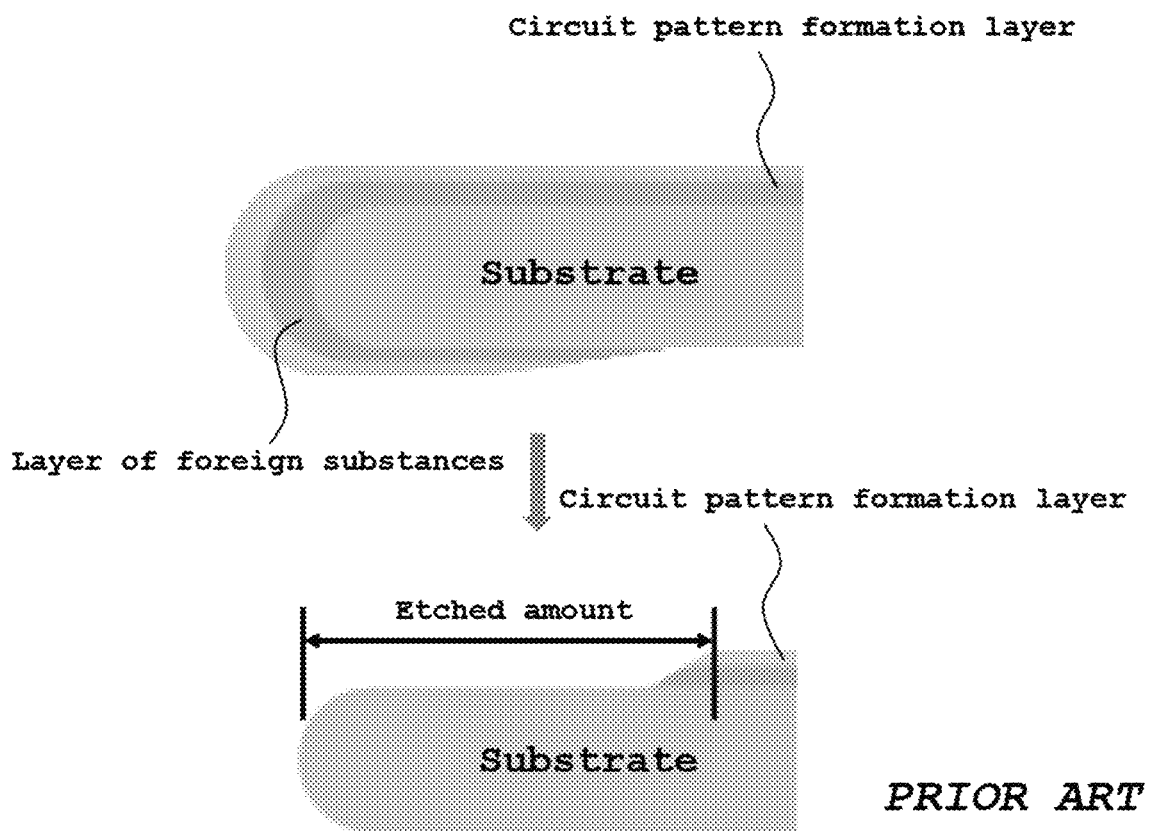
FIG. 1 is a schematic view showing a process of etching an edge of a substrate.
Figure 2:
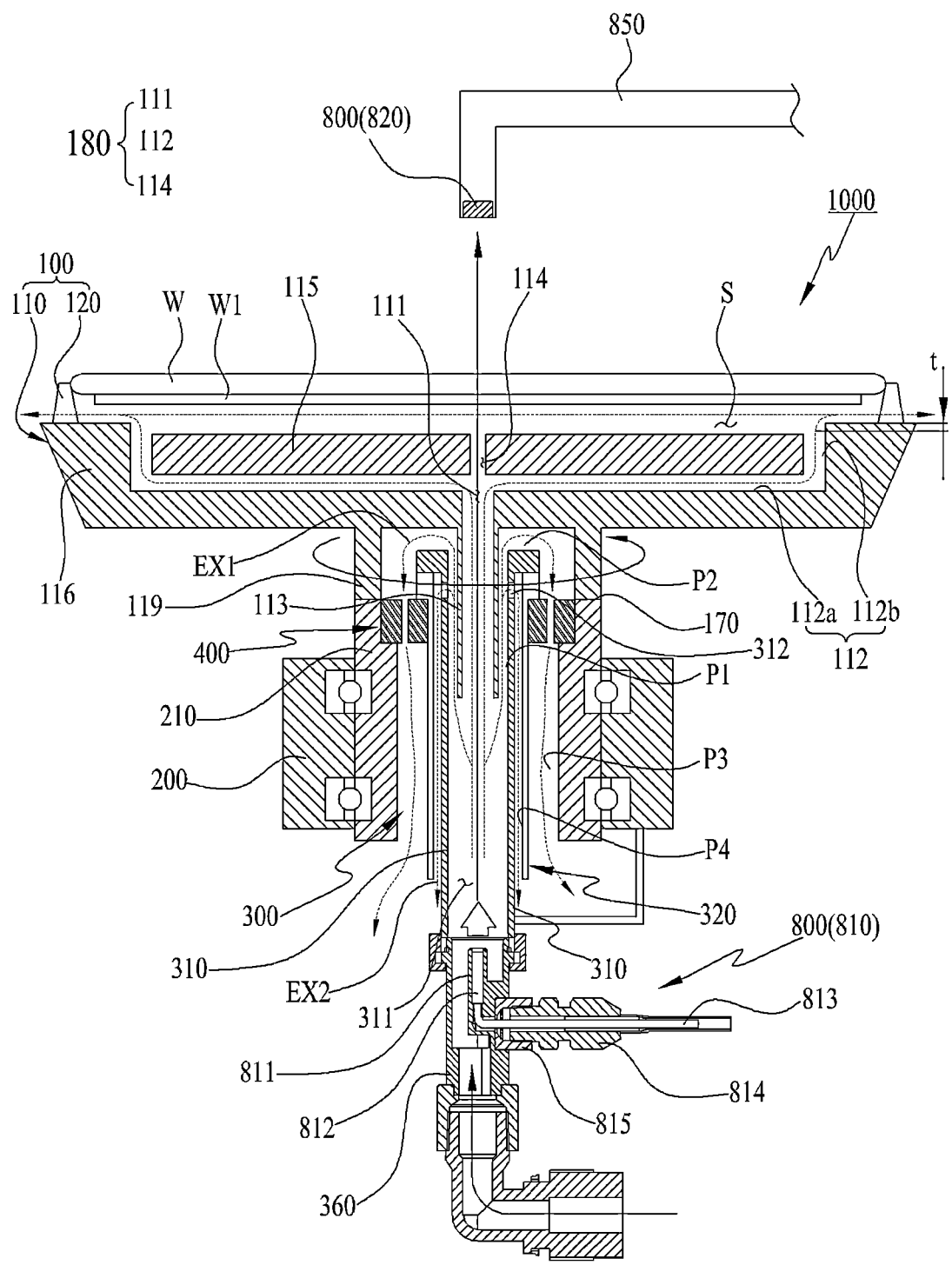
FIG. 2 is a longitudinal sectional view showing a substrate edge etching apparatus according to the present invention.

As shown in FIG. 2, a substrate edge etching apparatus 1000 includes: a substrate support assembly 100 having a horizontally rotatable chuck base 110 with a light through hole 180 vertically penetrating a center thereof and chuck pins 120 disposed on top of the chuck base 110 to support a substrate W; a spin motor 200 having a hollow tube-shaped driving shaft 210 adapted to rotate the substrate support assembly 100; a purge gas supply assembly 300 connected to the driving shaft 210 through a bearing 400 in a state of not rotating, extending vertically from the underside center of the chuck base 110 in a state of being spaced apart from an underside of the chuck base 110, and having a hollow hole 311 penetratingly extending therealong in an upward and downward direction thereof to supply a purge gas to the light through hole 180; and a substrate sensing unit 800 having a light transmission part 810 disposed inside the hollow hole 311 of the purge gas supply assembly 300 and a light reception part 820 disposed apart above the light through hole 180 of the chuck base 110.

Accordingly, light, which is transmitted from the light transmission part 810 and passes through the hollow hole 311 and the light through hole 180, is sensed by means of the light reception part 820, thereby making it possible to determine whether the substrate W exists or not.

In specific, if the light emitted from the light transmission part 810 is sensed by the light reception part 820, it is determined that the substrate W does not exist, and contrarily, if the light emitted from the light transmission part 810 is not sensed by the light reception part 820, it is determined that the substrate W exists because light transmission is cut off by means of the substrate W.

The light reception part 820, which is a part on which a light receiving sensor for sensing light is disposed, is installed on an arm or support frame 850 above a line connecting the light transmission part 810 and the light through hole 180 with each other.

Figure 4:
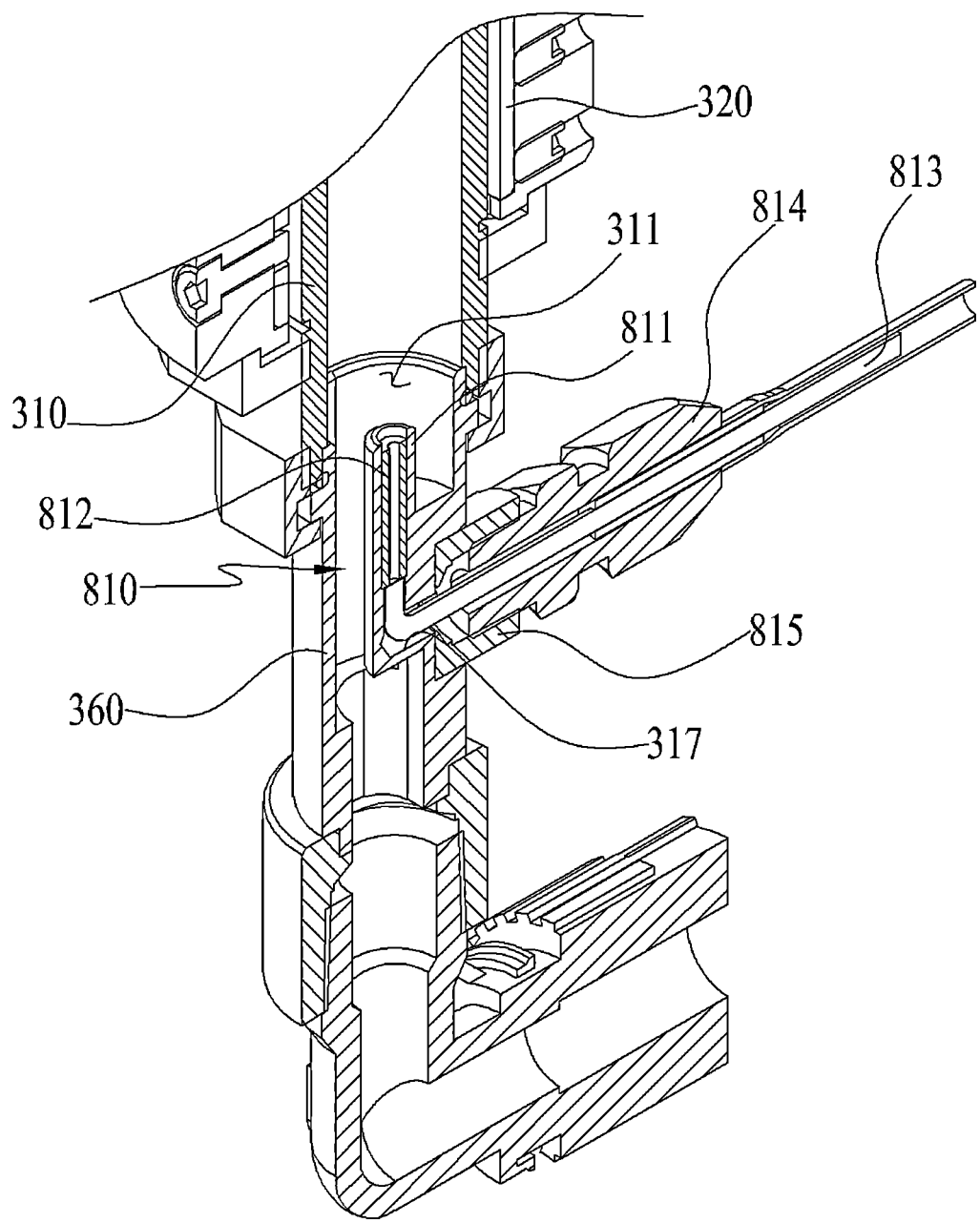
FIG. 4 is a sectional perspective view showing a light transmission part of FIG. 3.

As shown in FIGS. 2 and 4, the light transmission part 810 includes an inner tube 811 disposed inside the hollow hole 311 to extend toward the extension direction (vertical direction) of the hollow hole 311, a light transmitter 812 disposed inside the inner tube 811, and a cable 813 passing through a connection hole 317 formed on a side periphery of the purge gas supply assembly 300 and thus drawn to the outside from the light transmitter 812.

Accordingly, it is very simple and easy to install the light transmission part 810 on the substrate edge etching apparatus 1000.

In a plan view, the outer peripheral surface of the inner tube 811 is concentric with the inner peripheral surface of the hollow hole 311, thereby making it easy to manufacture the inner tube 811 and to enable the light emitted from the light transmitter 812 to easily pass through the light through hole 180.

The purge gas such as nitrogen gas (N2) and the like passes through a space between the inner peripheral surface of the hollow hole 311 and the outer peripheral surface of the inner tube 811 and then passes through a space between the chuck base 110 and the substrate W, thereby performing a purge function.

The cable 813 includes a power cable for supplying power to the light transmitter 812 and a communication cable for receiving data.

Further, the light transmission part 810 includes an adapter 814 detachably mounted on the connection hole 317 in a state of encompassing the cable 813, so that the sealed state of the cable 813 against the purge gas supply assembly 300 can reliably maintained and the cable 813 can be prevented from moving.

The adapter 814 is coupled to the connection hole 317 through a connection nut 815.

With respect to a vertical direction of the substrate edge etching apparatus 1000, the light through hole 180 is defined by a purge gas inlet hole 111 extending from an underside center of the chuck base 110 to an interior of the chuck base 110 in a vertical direction thereof, a purge gas outlet hole 112 extending radially from the purge gas inlet hole 111 and then extending upwardly to penetrate top of the chuck base 110, and a bypass path 114 extending vertically from a center of top of the chuck base 110 to communicate with the purge gas outlet hole 112.

Under the above-mentioned configuration, when the substrate W does not exist, the light emitted from the light transmission part 810 passes through the purge gas inlet hole 111, the purge gas outlet hole 112, and the bypass path 114, sequentially and then reaches the light reception part 820.

As a result, the purge gas inlet hole 111, the purge gas outlet hole 112, and the bypass path 114 as paths through which the purge gas passes are used as the light through hole 180 through which the light passes, thereby performing multi-functions and minimizing structural changes in installing the substrate sensing unit to thus ensure easy manufacturing.

Figure 3:
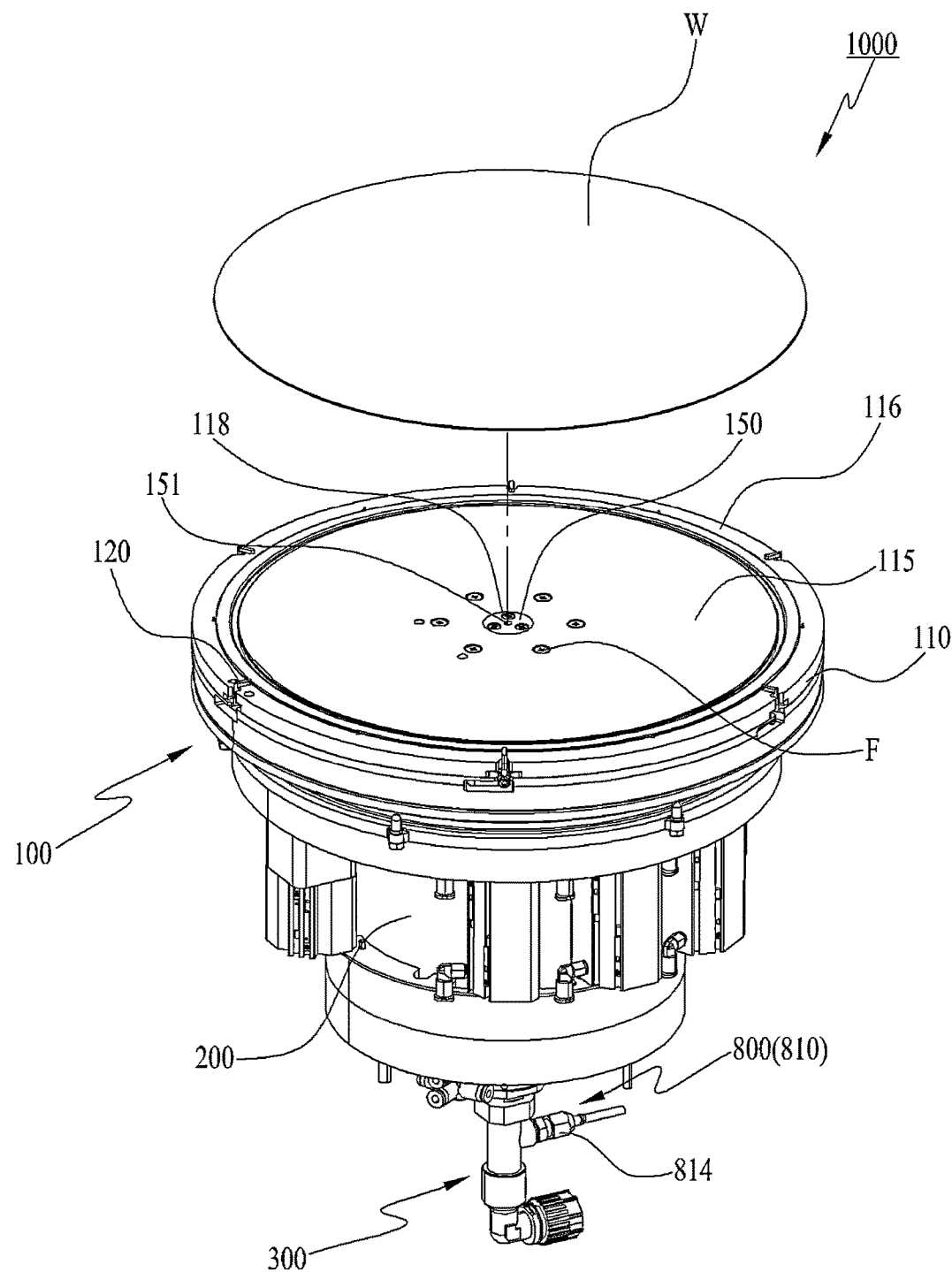
FIG. 3 is a perspective view showing the substrate edge etching apparatus according to the present invention.
Figure 5:
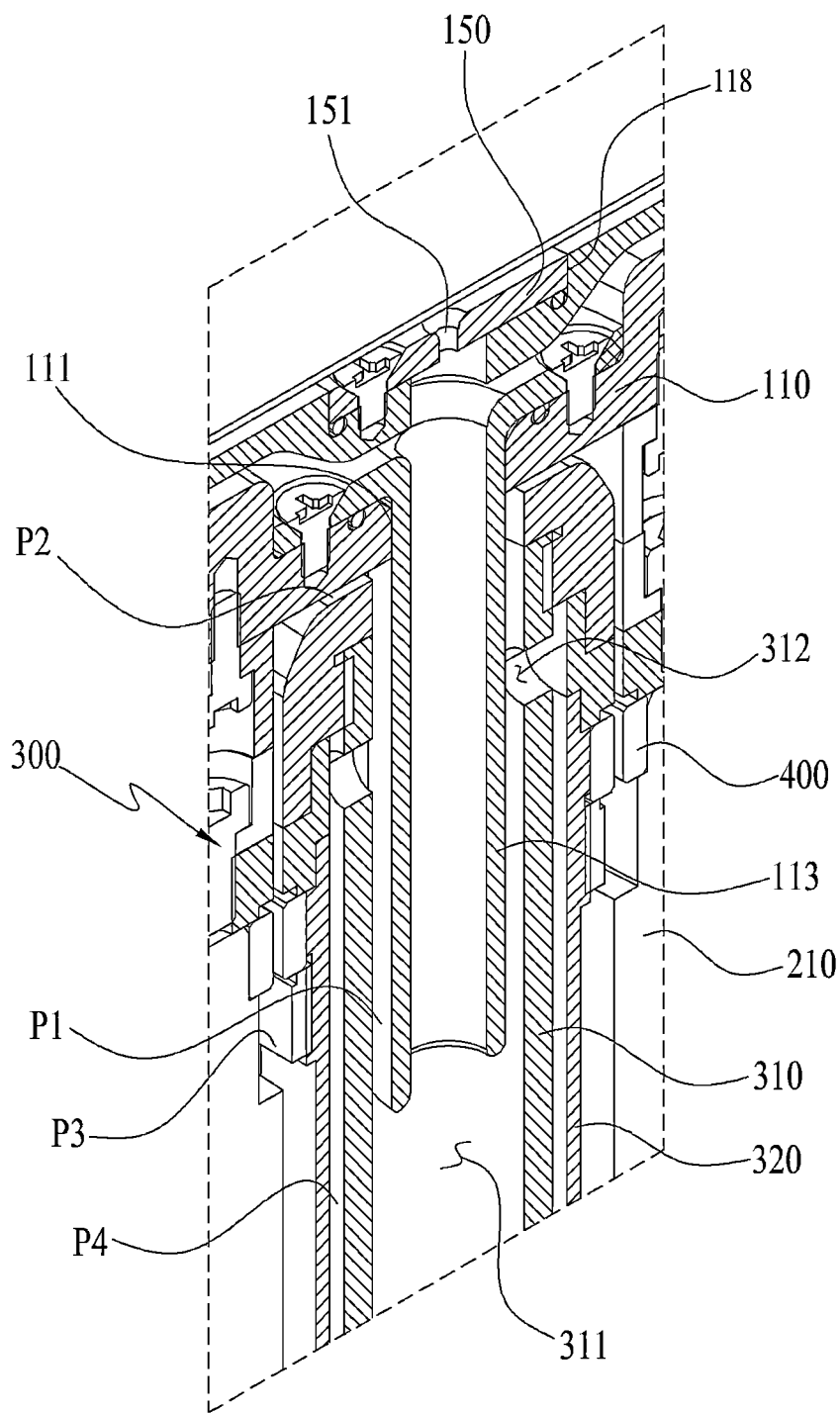
FIG. 5 is a sectional perspective view showing a configuration around a light through hole of FIG. 3.

As shown in FIGS. 3 and 5, the chuck base 110 has a cover 150 disposed on a cover installation hole 118 formed on a center thereof to cover the bypass path 114, and in this case, the cover 150 has a light emitting hole 151 formed thereon to communicate with the bypass path 114.

Accordingly, the purge gas, which passes through the bypass path 114, is exhausted through the light emitting hole 151 through which the light passes.

Unlike the above-mentioned configuration where the bypass path 114 is used as the light through hole 180, further, the chuck base 110 may have a cover 150 adapted to cover a top center thereof and made of a transparent material to perform only light transmission therethrough, while the light emitting hole 151 is being removed.

In this case, the purge gas is not exhausted through the light emitting hole 151 to the outside, and accordingly, the purge gas is exhausted only through the purge gas outlet hole 112.

The purge gas supply assembly 300 includes: a purge gas guide tube 310 spaced apart from a periphery of the purge gas inlet hole 111 in a radial direction thereof to surround the periphery of the purge gas inlet hole 111 in a plan view and having the hollow hole 311 penetratingly extending in the upward and downward direction thereof in a side view; a purge gas supply tube 360 connected with the lower end periphery of the purge gas guide tube 310 to communicate with the hollow hole 311 and having the connection hole 317 formed on the outer peripheral surface thereof; a purge gas introduction tube 113 extending downward from the underside of the chuck base 110 to communicate with the purge gas inlet hole 111 and spaced apart from the purge gas guide tube 310 in a radial direction thereof inside the purge gas guide tube 310; and a hollow tube-shaped purge gas guide tube support shaft 320 spacedly overlaid onto top of the purge gas guide tube 310 in an outer radial direction of the purge gas guide tube 310 and adapted to mount the bearing 400 thereonto to rotatably support the driving shaft 210.

The purge gas introduction tube 113 may be formed unitarily with the chuck base 110, but as shown in FIG. 5, the purge gas introduction tube 113 is configured to allow a top end periphery thereof to extend radially so that it can be detachably coupled to the chuck base 110.

Under the above-mentioned configuration, the purge gas such as N2 and the like is introduced through the purge gas guide tube 310. Next, a given amount of the purge gas is exhausted through the purge gas inlet hole 111 and the purge gas outlet hole 112 formed on the chuck base 110 to a space between the substrate W and top of the chuck base 110, and simultaneously, the rest of the purge gas is exhausted to the outside in a direction distant from the substrate W through a path between the purge gas inlet hole 111 and the purge gas guide tube 310 and the bearing 400, so that external particles or particles generated from the bearing 400 can be prevented from entering the substrate W through the bearing 400.

If a magnetic bearing is used as the bearing 400, no particles are generated from the bearing 400 itself, thereby avoiding the introduction of foreign substances into the substrate W.

In specific, through the purge gas introduction tube 113 extending downward from the underside of the chuck base 110 to communicate with the purge gas inlet hole 111, a flow rate of the purge gas passing through a space between the purge gas introduction tube 113 and the purge gas guide tube 310 can be introduced dividedly in a relatively accurate way, and further, the light emitted from the light transmission part 810 is guided well and passes through the light through hole 180 toward the light reception part 820.

Now, a process of sensing the substrate W through the substrate sensing unit 800 will be explained below.

Firstly, the chuck pins 120 on the chuck base 110 are open.

Secondly, after the substrate W is loaded on the chuck base 110, the existence of the substrate W is sensed by the substrate sensing unit 800.

Thirdly, if it is sensed that the substrate W is seated on the chuck base 110, the chuck pins 120 are closed to fix the substrate W thereto.

Fourthly, while a chemical liquid is being supplied, etching on the peripheral edge of the substrate W is normally performed.

Fifthly, if light is sensed by the light reception part 820 for one or more seconds during the etching process, rotation of the chuck base 110 is stopped and an alarm (sound or light) is generated.

Lastly, if the etching is normally finished, the rotation of the chuck base 110 is stopped, the chuck pins 120 are open to unload the substrate W therefrom, light receiving is checked to recognize the removal of the substrate W, and a standby state is kept to treat next substrate W.

Under the above-mentioned configuration, a path P1 formed between the purge gas introduction tube 113 and the purge gas guide tube 310, a path P2 formed between the underside of the chuck base 110 and the top end of the purge gas guide tube 310, and a path P3 formed between the purge gas guide tube support shaft 320 and the driving shaft 210 provide a first purge gas exhaust path EX1.

As the purge gas is exhausted to the outside through the first purge gas exhaust path EX1, a flow of external air is not introduced into a purge area through the bearing 400, thereby preventing a treatment surface W1 of the substrate W, on which a circuit pattern is formed, from being damaged and easily discharging the particles introduced through a connecting part 170 between the driving shaft 210 and the chuck base 110 to the outside.

Further, the purge gas guide tube 310 has a plurality of communication holes 312 spaced apart from one another on an upper peripheral surface thereof in a circumferential direction thereof, and accordingly, the path P1 formed between the purge gas guide tube 310 and the purge gas introduction tube 113, the plurality of communication holes 312, and a path P4 formed between the purge gas guide tube 310 and the purge gas guide tube support shaft 320 provide a second purge gas exhaust path EX2.

Under the above-mentioned configuration, the rest of the purge gas entering the path P1 between the purge gas guide tube 310 and the purge gas introduction tube 113 excepting a given amount of the purge gas passing through the first purge gas exhaust path EX1 is exhausted through the second purge gas exhaust path EX2, so that it is possible to completely discharge the foreign substances remaining between the purge gas guide tube 310 and the purge gas guide tube support shaft 320.

While the chuck base 110 is rotating, in specific, a pressure around a connected portion between the purge gas guide tube 310 and the purge gas guide tube support shaft 320 becomes decreased to prevent particles in the flow of external air from entering through a minute gap occurring in a coupled structure between the purge gas guide tube 310 and the purge gas guide tube support shaft 320.

As mentioned above, further, the chuck base 110 has the bypass path 114 formed on the center of top thereof to communicate with the purge gas outlet hole 112, thereby preventing a negative pressure from being generated from a space S between the chuck base 110 and the substrate W to keep the substrate W from sagging down toward the top of the chuck base 110 or to keep external particles from being collected to the space S.

Further, as shown in FIG. 2, the chuck base 110 is configured to have an inside part 115 and an outside part 116 with respect to the purge gas outlet hole 112 in a longitudinal sectional view, and in this case, the inside part 115 is lower in height than the outside part 116 (See a reference symbol 't' of FIG. 2). Accordingly, the substrate W can be prevented from sagging down and coming into contact with top of the inside part 115 of the chuck base 110.

The inside part 115 is separatedly provided from the outside part 116 and detachably fastened to the outside part 116 by means of fastening members F such as screws or bolts.

Further, as shown in FIGS. 2 and 4, the purge gas guide tube 310 is detachably connected to the purge gas supply tube 360 along the lower end periphery thereof, but of course, the purge gas guide tube 310 may be formed unitarily with the purge gas supply tube 360.

As described above, the substrate edge etching apparatus according to the present invention is configured to have the substrate support assembly having the horizontally rotatable chuck base with the light through hole vertically penetrating a center thereof and the chuck pins disposed on top of the chuck base to support the substrate; the spin motor having the hollow tube-shaped driving shaft adapted to rotate the substrate support assembly; the purge gas supply assembly connected to the driving shaft through the bearing in a state of not rotating, extending vertically from the underside center of the chuck base in a state of being spaced apart from an underside of the chuck base, and having the hollow hole penetratingly extending therealong in the upward and downward direction thereof to supply the purge gas to the light through hole; and the substrate sensing unit having the light transmission part disposed inside the hollow hole of the purge gas supply assembly and the light reception part disposed apart above the light through hole of the chuck base, wherein light that is transmitted from the light transmission part and passes through the hollow hole and the light through hole is sensed by means of the light reception part.

Accordingly, the substrate edge etching apparatus according to the present invention adopts the low-priced light-transmitting and receiving sensors, thereby greatly reducing a production cost thereof.

According to the present invention, further, the purge gas inlet hole, the purge gas outlet hole, and the bypass path as paths through which the purge gas passes are used as the light through hole through which the light passes, thereby performing multi-functions and minimizing structural changes in installing the substrate sensing unit to ensure easy manufacturing.

According to the present invention, desirably, the light transmission part includes the inner tube disposed inside the hollow hole to extend toward the extension direction of the hollow hole, the light transmitter disposed inside the inner tube, and the cable passing through the connection hole formed on the side periphery of the purge gas supply assembly and thus drawn to the outside from the light transmitter, thereby making it easy and simple to install the light transmission part on the substrate edge etching apparatus.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate edge etching apparatus comprising:
   a substrate support assembly having a horizontally rotatable chuck base with a light through hole vertically penetrating a center thereof and chuck pins disposed on top of the chuck base to support a substrate;
   a spin motor having a hollow tube-shaped driving shaft adapted to rotate the substrate support assembly;

a purge gas supply assembly connected to the driving shaft through a bearing in a state of not rotating, extending vertically from the underside center of the chuck base in a state of being spaced apart from an underside of the chuck base, and having a hollow hole penetratingly extending therealong in an upward and downward direction thereof to supply a purge gas to the light through hole; and a substrate sensing unit having a light transmission part, which includes a light transmitter disposed inside the hollow hole of the purge gas supply assembly, and a light reception part disposed apart above the light through hole of the chuck base, wherein light that is transmitted from the light transmission part and passes through the hollow hole and the light through hole is sensed by means of the light reception part.

2. The substrate edge etching apparatus according to claim 1, wherein the light transmission part comprises:

an inner tube disposed inside the hollow hole to extend toward the extension direction of the hollow hole;

the light transmitter disposed inside the inner tube; and a cable passing through a connection hole formed on a side periphery of the purge gas supply assembly and thus drawn to the outside from the light transmitter.

3. The substrate edge etching apparatus according to claim 2, wherein the light transmission part further comprises an adapter detachably mounted on the connection hole in a state of encompassing the cable.

4. The substrate edge etching apparatus according to claim 1, wherein the light through hole is defined by a purge gas inlet hole extending from an underside center of the chuck base to an interior of the chuck base in a vertical direction thereof, a purge gas outlet hole extending radially from the purge gas inlet hole and then extending upwardly to penetrate top of the chuck base, and a bypass path extending vertically from a center of top of the chuck base to communicate with the purge gas outlet hole.

5. The substrate edge etching apparatus according to claim 4, wherein the purge gas supply assembly comprises:

a purge gas guide tube spaced apart from a periphery of the purge gas inlet hole to surround the periphery of the purge gas inlet hole in a radial direction thereof in a plan view and having the hollow hole penetratingly extending in the upward and downward direction in a side view;

a purge gas supply tube connected with the lower end periphery of the purge gas guide tube to communicate with the hollow hole and having the connection hole formed on the outer peripheral surface thereof, a purge gas introduction tube extending downward from the underside of the chuck base to communicate with the purge gas inlet hole and spaced apart from the purge gas guide tube in a radial direction thereof inside the purge gas guide tube; and a hollow tube-shaped purge gas guide tube support shaft spacedly overlaid onto top of the purge gas guide tube in an outer radial direction of the purge gas guide tube and adapted to mount the bearing thereonto to support the driving shaft.

6. The substrate edge etching apparatus according to claim 5, wherein a path formed between the purge gas introduction tube and the purge gas guide tube, a path formed between the underside of the chuck base and the top end of the purge gas guide tube, and a path formed between the purge gas guide tube support shaft and the driving shaft provide a first purge gas exhaust path.

7. The substrate edge etching apparatus according to claim 6, wherein the purge gas guide tube has a plurality of communication holes spaced apart from one another on an upper surface thereof in a circumferential direction thereof, and the path formed between the purge gas guide tube and the purge gas introduction tube, the plurality of communication holes, and a path formed between the purge gas guide tube and the purge gas guide tube support shaft provide a second purge gas exhaust path.

8. The substrate edge etching apparatus according to claim 4, wherein the chuck base comprises a cover installation hole formed on a center thereof to communicate with the bypass path, a cover detachably mounted on the cover installation hole, and a light emitting hole formed on a center of the cover thereon to allow the bypass path to communicate with the outside.

9. The substrate edge etching apparatus according to claim 4, wherein the chuck base comprises a cover installation hole formed on a center thereof to communicate with the bypass path and a cover detachably mounted on the cover installation hole and made of a transparent material.

* * * * *